Aug. 12, 1958 E. S. WENDOLKOWSKI ET AL 2,847,648

PRINTED DELAY LINE

Filed Feb. 2, 1954 2 Sheets-Sheet 1

INVENTOR.
E. S. WENDOLKOWSKI
A. C. WALKER
BY James P. Malone

Aug. 12, 1958 E. S. WENDOLKOWSKI ET AL 2,847,648

PRINTED DELAY LINE

Filed Feb. 2, 1954 2 Sheets-Sheet 2

INVENTOR.
E. S. WENDOLKOWSKI
A. C. WALKER
BY James B. Malone

United States Patent Office 2,847,648

Patented Aug. 12, 1958

2,847,648

PRINTED DELAY LINE

Eugene S. Wendolkowski, Hempstead, and Alfred C. Walker, Levittown, N. Y., assignors to Control Electronics Company, Inc., Huntington, N. Y.

Application February 2, 1954, Serial No. 407,760

2 Claims. (Cl. 333—29)

This invention relates to precision capacitors and delay lines and more particularly, to means, methods and apparatus for accurately manufacturing and adjusting the same.

The invention relates more particularly to printed capacitors and circuits and methods and apparatus for accurately calibrating, adjusting and trimming such capacitors with machine cutting tools of great accuracy and speed, thereby providing speed and efficiency with resulting economy.

The modern trend in the manufacture of electrical components is toward miniaturization including printed circuitry and various circuits and circuit elements having been produced by printing techniques. By printing techniques is meant such processes and methods as photo-etching, electro-depositing, silk-screening and etching, painting with conductive paint, foil pattern laminating and the like.

The present invention provides means, methods and apparatus for producing printed capacitors to very close specifications of electrical capacity. A particular embodiment which will be fully described in this application is a precision delay line which is used in precision electronic equipment such as, computers and radar equipment. A delay line functions to delay an input signal a definite time interval which is generally measured in microseconds i. e. millionths of a second. The delay in miscroseconds is a function of the capacity of the capacitors in the line. Therefore, these capacitors must be very accurately made.

The present method of manufacturing accurate capacitors or accurate delay lines combines the advantages of the use of variable capacitors with the speed and economy of fixed capacitors.

To make an accurate delay line according to prior practice, the delay may be adjusted by employing variable capacitors and adjusting them until the correct delay is obtained. The capacitors are adjusted while the delay is being measured by suitable apparatus. This method is to a reasonable degree independent of the value of the coils used. That is, the coil may be constructed to a reasonable tolerance of inductance.

Another method is to measure and select fixed capacitors from a given lot and combine these with coils which have been constructed to a high accuracy. This method depends on the use of highly accurate coils and capacitors. It is obviously expensive from the standpoint of material and labor.

One method requires the use of highly accurate components so that the finished product will have characteristics within a certain tolerance. The other method uses components of nominal tolerance and provides for the adjustment under actual use conditions.

Accordingly, a principal object of the invention is to provide new and improved printed capacitors which are adapted to be made with great accuracy.

Another object of the present invention is to provide new and improved means, methods and apparatus for producing printed capacitors, with great accuracy, speed and economy.

Another object of the present invention is to provide new and improved precision delay lines.

Another object of the present invention is to provide new and improved methods, apparatus and means for producing precision delay lines.

Another object of the invention is to provide new and improved means, methods and apparatus for manufacturing precision capacitors and delay lines in a very accurate, rapid, and inexpensive manner.

Another object of the present invention is to provide new and improved precision delay lines comprising a plurality of coils connected in series, a conductive covering on one side of said plate, a plurality of conductive elements or coverings on the other side of said plate, each connected to one of said coil connections, said coils being mounted on said plate.

Another object of the present invention is to provide a new and improved method of manufacturing precision capacitors and delay lines comprising the steps of printing a solid conductive coating on one side of the dielectric plate, printing separate conductive elements on the other side of said plate, mounting said plate in a machine tool having a cutting edge and trimming at least one of said conductive coatings with said machine tool to thereby trim the capacitor formed by the di-electric plate and the two conductive coatings.

These and other objects of the invention will be apparent from the following specification and figures of which:

Figure 1:
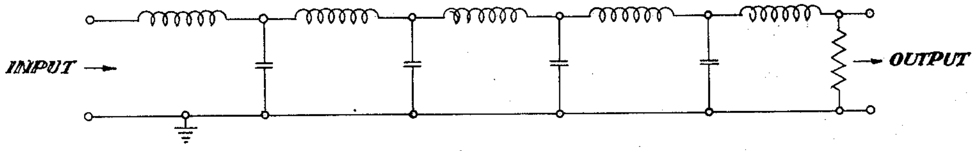
Figure 1 is a schematic circuit diagram of a delay line.

A delay line consists chiefly of a series of inductances and capacitors of essentially identical characteristics which when combined in the manner shown by the circuit diagram in Fig. 1 will produce a time delay in an input signal. The quality of the output signal and the total time of delay are a function of the individual inductance-capacitance sections of the line. For high quality, the sections must be identical and numerous sections per unit delay must be provided. The inductance coils can readily in practice be produced to reasonable tolerance and compensation for coil variation may be made by adjustment of the capacitors. This invention outlines a method of (1) producing inexpensive, accurate (identical) capacitors; (2) tuning these capacitors to obtain high tolerance for delay per section and quality of output; and (3) taking advantage of the nature of these capacitor segments for switching purposes in the construction of a variable delay line.

In general, there are two characteristics of a delay line which may be adjusted by the use of adjustable capacitors. The first of these is the total delay or delay per section which has been previously discussed. This is proportional to the product of inductance and capacitance.

$$D=\sqrt{LC}$$

Where $D$=delay per section in seconds,
$L$=inductance of coil in henries
$C$=capacitance of capacitor in farads The second of these characteristics is called "Characteristic Impedance." The uniformity of the characteristic impedance from section to section determines the size and number of "reflections" or spurious signals produced by the delay line. This is proportional to the value of inductance of each section divided by the value of capacitance of each section:

$$Z=\sqrt{L/C}$$

When this ratio of value of inductance to capacitance is maintained constant for each section, there will occur a minimum of such reflections and spurious signals.

The present method of producing a highly accurate delay line consists of first producing sufficiently accurate inductance coils (which in general, as stated before, can be done economically), then combining these coils with either carefully selected high tolerance capacitors and accepting the resulting total delay tolerance, or by combining these coils with expensive variable capacitors and then individually tuning each capacitor to provide the accurate delay. Where a variable delay line is required, these sections are then soldered to a multi-position switch, thereby providing a tap at any desired time delay with steps equivalent to the unit delay of each section.

The proposed method consists of using coils similar to those used in existing methods requiring a reasonable total inductance of all coils and a relatively high accuracy in the similarity of individual sections. This is the requirement for all present delay lines. The capacitors are then constructed by any of the circuit printing methods such as photo-etching, electro-depositing, silk screening and etching, painting with conductive paint, foil pattern laminating, etc. In general, any method is acceptable whereby two plates of conductive material are seperated by an insulating material. The insulating material may consist of any of the well known plastics, ceramics, mica, treated paper, etc., but must be chosen properly for the particular application of the delay line. For high frequency work and output quality, materials with low dissipation factors are required. Plastics are of course handiest to use but only the highest-grade materials such as Teflon, silicon, etc., are suitable.

These printed capacitors are printed in a pattern most convenient for the particular application. In the case of fixed delay lines, a pattern will generally take a straight bar form, similar to that shown in Figure 2.

Figure 2:
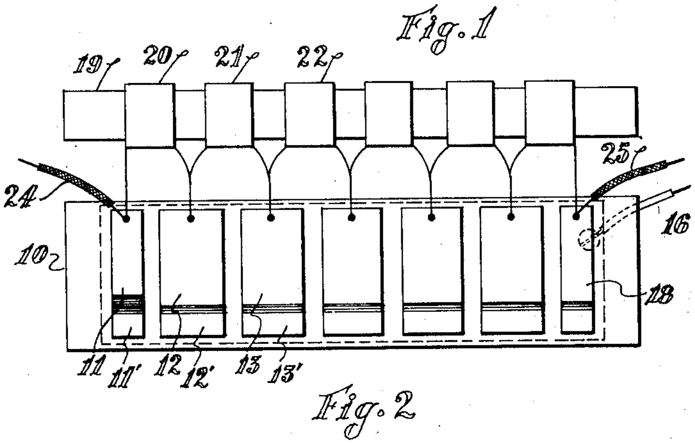
Figure 2 is an exploded plan view of an embodiment of the precision delay line of the present invention.
Figure 2A:
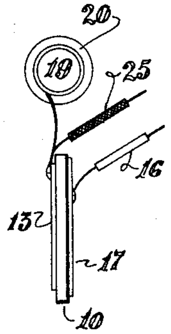
Figure 2A is a side view of Figure 2.

Figures 2 and 2A show an embodiment of the invention comprising a di-electric plate 10, a plurality of conductive segments or separated coatings, 11, 12, 13 etc. which are printed on top of the plate 10, and a plurality of coils 20, 21, 22, etc. are mounted on any convenient mounting means such as a rod 19. The rod 19 is preferably mounted on the plate 10 in a convenient manner. In the showing in Fig. 2, the coils are shown dismounted for purposes of illustration. Each one of the capacitor plates 11, 12, 13, is connected to the connection between the coils in the manner shown in Figure 1. Note that the input and output capacitor sections 11 and 18 are approximately half-size for electrical matching purposes.

Referring also to Figure 2A, a solid strip of conductive material 17 is printed on the bottom of the di-electric plate 10, thus forming the common conductor of the condensers shown in Figure 1. The plate 17 may be connected to the circuit ground by the lead 16. Input and output leads 24 and 25 are also provided. The individual capacitors are trimmed by placing the strip 10 in a machine tool having a cutting edge and cutting small strips 11′, 12′, 13′ off the conductive plates 11, 12, 13, and alternately measuring the delay. In this manner the condensers may be trimmed and matched very accurately since a machine tool is capable of taking off as little as a few 10,000ths of an inch of material at a time.

It is not necessary to shave off all the capacitor area them originally undersized and then adding conductive used portion of the capacitor plate from the used portion. However, if the common capacitor plate is trimmed, the unused portion should be completely removed.

The capacitor plates could be trimmed by making them originally undersized and then adding conductive paint to give more surface area. However, this is a tedious process and it is lengthy since the delay measurements can only be made after the paint has dried. The capacitors could also be trimmed by drilling small holes through the capacitor plates or in the case of the very thin plate, by cutting the entire plate, for instance with a scissors or equivalent cutting tool. Another method is to trim the capacitor plates with a machine tool cutting edge, for instance, in a lathe.

Figure 3:
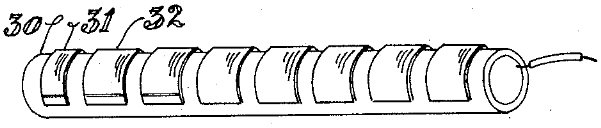
Figure 3 is a perspective view of a modification of the invention showing a tubular capacitor strip.

Figure 3 shows a modification of the invention having a tubular capacitor strip. In this embodiment, the di-electric plate 30 is formed into a cylinder preferably after the conductor coatings 31, 32 and the solid conductive coating on the inside have been printed on the plate.

Figures 3A, 4:
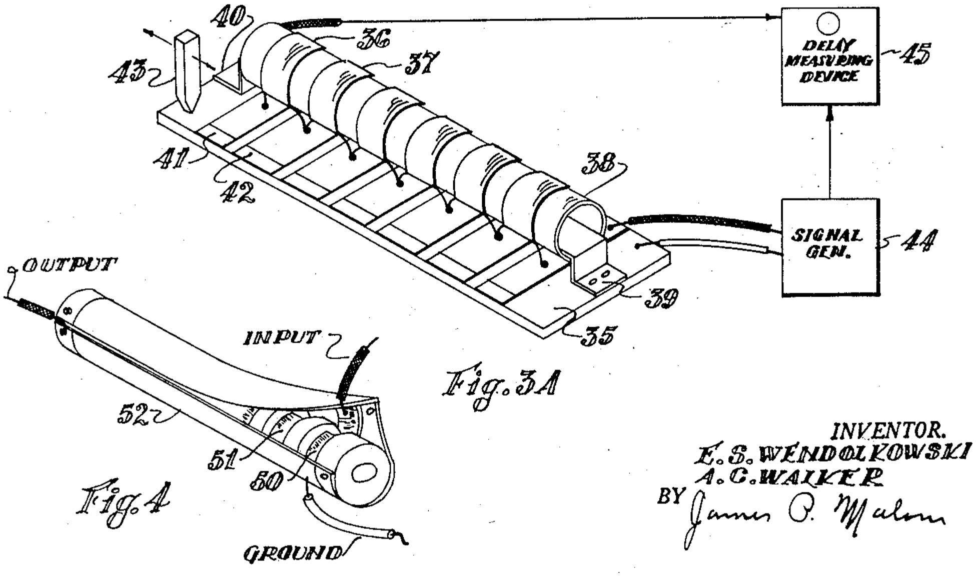
Figure 3A is a perspective view of a precision delay line embodiment of the invention, and testing arrangement.
Figure 4 is a perspective view of a precision delay line embodiment of the invention.

Figure 3A shows a modification of the invention having a capacitor strip 35 similar to that of Figure 2 and showing the coils 36, 37, etc., mounted on a cylinder 38 which is connected to the plate 35 by means of the brackets 39 and 40. The individual capacitor sections 41, 42, etc. may be trimmed by a machine tool cutting edge 43 which is shown schematically. The delay may be measured by providing a signal from signal generator 44 which signal is fed through the delay line and then to a delay measuring means 45 which may be a cathode ray oscillograph. The delay measuring means is completely conventional.

Figure 4 shows a modification of the invention wherein the coils 50, 51, etc. are mounted on an inner cylinder and the capacitor plate 52 is wrapped around thereby providing a very compact and neatly packaged delay line.

Figure 5:
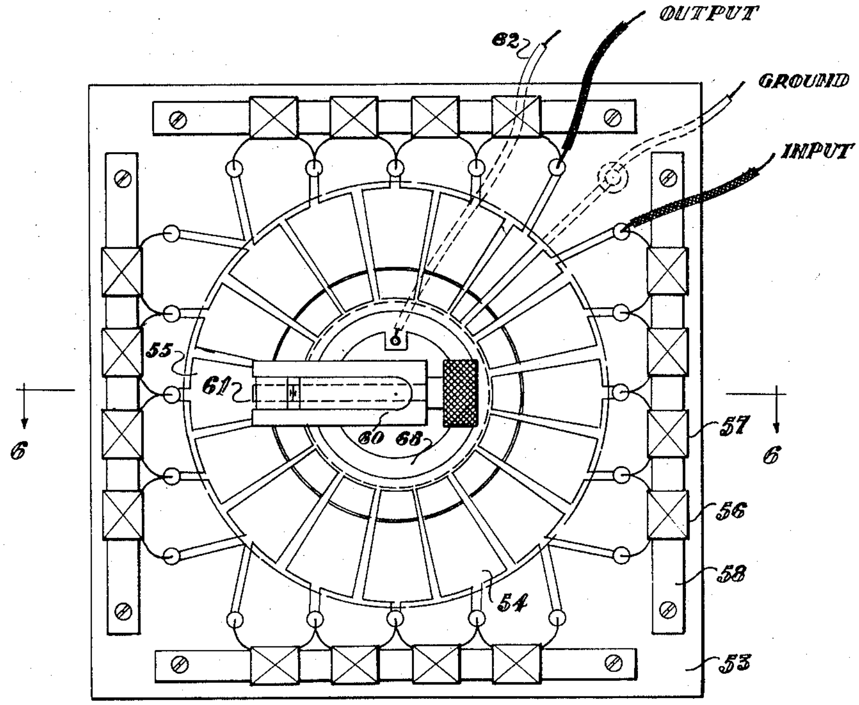
Figure 5 is a plan view of an embodiment of the invention mounted with a machine cutting tool and, Figure 6 is a side view of Figure 5.
Figure 6:
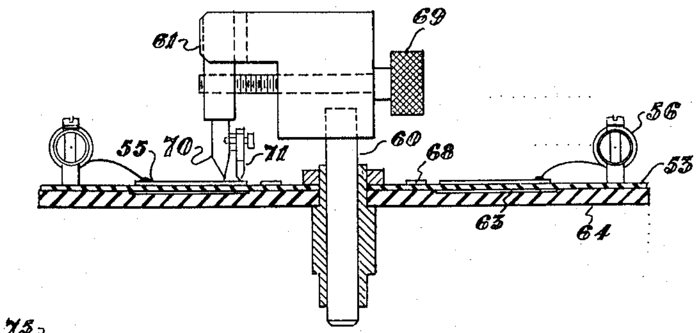
Figure 7:
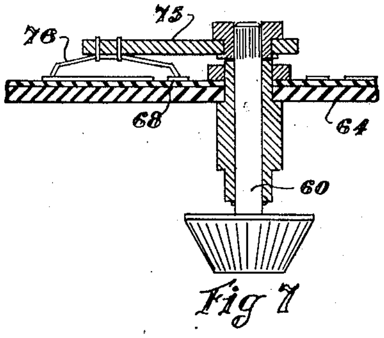
Figure 7 is a detail view of a typical wiper arm.

Figures 5 and 6 show views of a variable delay line. It comprises a di-electric plate 53 having a solid conductive layer 63 on the bottom side and a plurality of conductive segments or coatings 54, 55, etc. A backing plate 64 is used for mechanical strength. The coils 56, 57, etc. are mounted on suitable mounting brackets 58, and connected to the capacitor elements in the manner shown in Figure 1. A shaft 60 is rotatably mounted on the plate 53 and a wiper contact, shown in Fig. 7, is normally mounted on the shaft 60. The wiper contact is connected to an output lead 62 through slipring 68 on the shaft 60, and is adapted to contact the various conductive segments.

For trimming the variable delay line, a rotatable machine tool cutting head 61 is mounted on the shaft 60 as shown in Figures 5, 6. The cutting head 61 replaces the wiper contact normally used. The rotatable machining head has a cutting edge 70 which is preferably adjustable both as to the cutting radius by adjustment 69 and also to the depth of cut. The depth adjustment of slotted member 71 is not too critical, since it is only necessary to remove the conductive portion and any portion of the di-electric plate that is removed does not have any great significance.

Where a variable delay line is being produced, an additional advantage exists in that the individual capacitor plates are also used as switch plates. In as much as the general circuit for a delay line, Figure 1, calls for one side of all the capacitors in the line to be on a common line, or ground line, the capacitor strips therefore are printed with simply one common plate, thereby making all these interconnections.

Figure 7 shows a detail view of a typical wiper arm. The horizontal arm 75 is mounted on the rotatable shaft 60, and has a wiper 76 which connects slipring 68 to the individual segments 55, etc.

Since present manufacturing methods do not produce metal-clad insulation laminates to high thickness tolerances, it is obvious that the total capacitance of the printed capacitors will vary with the thickness of the material. It is therefore, necessary to print the capacitor sections on a larger area than required; then, through the use of a trimming method, the area of the capacitance plates is decreased until the required capacitance is obtained.

In the present application the delay lines are described as being made up of coils and capacitors of which there is one capacitor for each coil or junction between coils. This is not always necessarily so, since there can be various arrangements such as a tapped coil in which the capacitor is used at a center point of the coil and no capacitor attached to the junction between coils.

We claim:

1. A variable delay line comprising a plurality of coils connected in series, a plurality of condensers each connected from one of said coil connections and to the other side of the line, said condensers comprising a plate of di-electric material, a conductive element on one side of said plate, and a plurality of separate conductive elements arranged in a circle on the other side of said plate each of said members being connected to one of said coil connections, said coils being mounted on said plate and a switch mounted on said plate, and comprising a rotatable wiper adapted to contact said separate conductive elements to thereby provide a variable delay line.

2. A variable delay line comprising a plurality of coils connected in series, a plurality of condensers each connected from one of said coil connections and to the other side of the line, said condensers comprising a plate of di-electric material, a conductive element on one side of said plate, and a plurality of separate conductive elements on the other side of said plate, each of said members being connected to one of said coil connections, said coils being mounted on said plate, a rotatable member mounted on said plate, and a wiper on said rotatable member adapted to contact said separate conductive elements to thereby provide a variable delay line, said wiper being removable and replaceable with a cutting tool for trimming said condensers equally.

References Cited in the file of this patent

UNITED STATES PATENTS

| | | |
|---|---|---|
| 1,650,395 | Siegel | Nov. 22, 1927 |
| 1,682,712 | Pierce | Aug. 28, 1928 |
| 2,431,023 | Browne et al. | Nov. 18, 1947 |
| 2,603,737 | Erdman | July 15, 1952 |
| 2,637,778 | Kodoma | May 5, 1953 |
| 2,694,185 | Kodoma | Nov. 9, 1954 |

FOREIGN PATENTS

| | | |
|---|---|---|
| 314,167 | Great Britain | June 27, 1929 |